(12) United States Patent
Chen et al.

(10) Patent No.: US 8,502,146 B2
(45) Date of Patent: Aug. 6, 2013

(54) METHODS AND APPARATUS FOR CLASSIFICATION OF DEFECTS USING SURFACE HEIGHT ATTRIBUTES

(75) Inventors: Chien-Huei Chen, San Jose, CA (US); Hedong Yang, Santa Clara, CA (US); Cho H. Teh, Cupertino, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/252,042

(22) Filed: Oct. 3, 2011

(65) Prior Publication Data

US 2013/0082174 A1   Apr. 4, 2013

(51) Int. Cl.
*G01N 23/00*  (2006.01)

(52) U.S. Cl.
USPC ............................. 250/311; 250/306; 250/307

(58) Field of Classification Search
USPC .......................................... 250/306, 307, 311
See application file for complete search history.

(56) References Cited

U.S. PATENT DOCUMENTS

| 6,353,222 | B1 | 3/2002 | Dotan | |
|---|---|---|---|---|
| 2002/0161534 | A1* | 10/2002 | Adler et al. | 702/35 |
| 2004/0084622 | A1* | 5/2004 | Kadyshevitch et al. | 250/310 |
| 2004/0188611 | A1* | 9/2004 | Takeuchi et al. | 250/310 |
| 2009/0077696 | A1 | 3/2009 | Kang et al. | |
| 2010/0154521 | A1 | 6/2010 | Budach | |
| 2011/0114838 | A1* | 5/2011 | Han et al. | 250/307 |
| 2012/0223227 | A1* | 9/2012 | Chen et al. | 250/307 |

FOREIGN PATENT DOCUMENTS

JP        2008-282761 A    11/2008

OTHER PUBLICATIONS

PCT International Search Report and Written Opinion of the International Searching Authority for Application No. PCT/US2012/056317, Feb. 28, 2013, 9 sheets.

* cited by examiner

*Primary Examiner* — Robert Kim
*Assistant Examiner* — Jason McCormack
(74) *Attorney, Agent, or Firm* — Okamoto & Benedicto LLP (57) ABSTRACT

One embodiment relates to a method of classifying a defect on a substrate surface. The method includes scanning a primary electron beam over a target region of the substrate surface causing secondary electrons to be emitted therefrom, wherein the target region includes the defect. The secondary electrons are detected from the target region using a plurality of at least two off-axis sensors so as to generate a plurality of image frames of the target region, each image frame of the target region including data from a different off-axis sensor. The plurality of image data frames are processed to generate a surface height map of the target region, and surface height attributes are determined for the defect. The surface height attributes for the defect are input into a defect classifier. Other embodiments, aspects and features are also disclosed.

20 Claims, 11 Drawing Sheets

METHODS AND APPARATUS FOR CLASSIFICATION OF DEFECTS USING SURFACE HEIGHT ATTRIBUTES

BACKGROUND OF THE INVENTION

1. Field of the Invention

The present invention relates to inspection and review of substrates using electron beam imaging.

2. Description of the Background Art

In a conventional electron beam inspection instrument, a manufactured substrate (such as a silicon wafer or a reticle) is scanned with a focused beam of electrons which results in the emission of electrons, including secondary and/or backscattered electrons, from the substrate surface. The emitted electrons are detected, and the detection data is typically converted into an image of the surface of the specimen. The image is typically from a "normal" view (i.e. a view from a perspective perpendicular to the surface). These images are then analyzed numerically to detect abnormalities (referred to as defects) in the manufactured substrate.

Furthermore, the detected defects may be reviewed by further imaging and classified, either manually or automatically, into different classes or categories. The classification of a defect may be used to determine its cause such that appropriate adjustments may be made in the manufacturing process so as to improve its yield.

It is highly desirable to improve methods and apparatus for electron beam inspection. More particularly, it is highly desirable to improve the classification of defects imaged by electron beam instrumentation.

SUMMARY

One embodiment relates to a method of classifying a defect on a substrate surface. The method includes scanning a primary electron beam over a target region of the substrate surface causing secondary electrons to be emitted therefrom, wherein the target region includes the defect. The secondary electrons are detected from the target region using a plurality of at least two off-axis sensors so as to obtain a plurality of image frames of the target region, each image frame of the target region including data from a different off-axis sensor. The plurality of image data frames are processed to generate a surface height map of the target region. Surface height attributes are determined for the defect. The surface height attributes for the defect are input into a defect classifier.

The method may be applied to a bare substrate, such as a bare semiconductor wafer, or a patterned substrate, such as an integrated circuit being manufactured or a reticle for lithography. In the latter case, a plurality of corresponding image frames may be obtained of a reference site which corresponds to the target region, a surface height map of the reference site is generated, and the determination of surface height attributes for the defect may also use the surface height map of the reference site.

Another embodiment relates to an apparatus including a source for generating a primary electron beam, scan deflectors configured to controllably deflect the primary electron beam, a control system configured to control the scan deflectors such that the primary electron beam is scanned over areas on a substrate surface, and a detection system configured for the detection of secondary electrons using a plurality of at least two off-axis sensors so as to generate a plurality of image frames of each of the areas. The areas scanned may include a target region which includes a defect to be classified, and, in certain cases, a reference site corresponding to the target region. An image data processing system may be configured to process the plurality of image frames to generate a surface height map of the target region and the reference site, if applicable. The image data processing system may determine surface height attributes for the defect using the surface height map(s), and input the surface height attributes for the defect into a defect classifier.

Other embodiments, aspects and features are also disclosed.

DETAILED DESCRIPTION

Methods and apparatus for the generation of surface height attributes and the use of these attributes are disclosed herein. These methods and apparatus may be employed to substantially improve the accuracy of automated defect classification using electron-beam instrumentation.

Figure 1A:
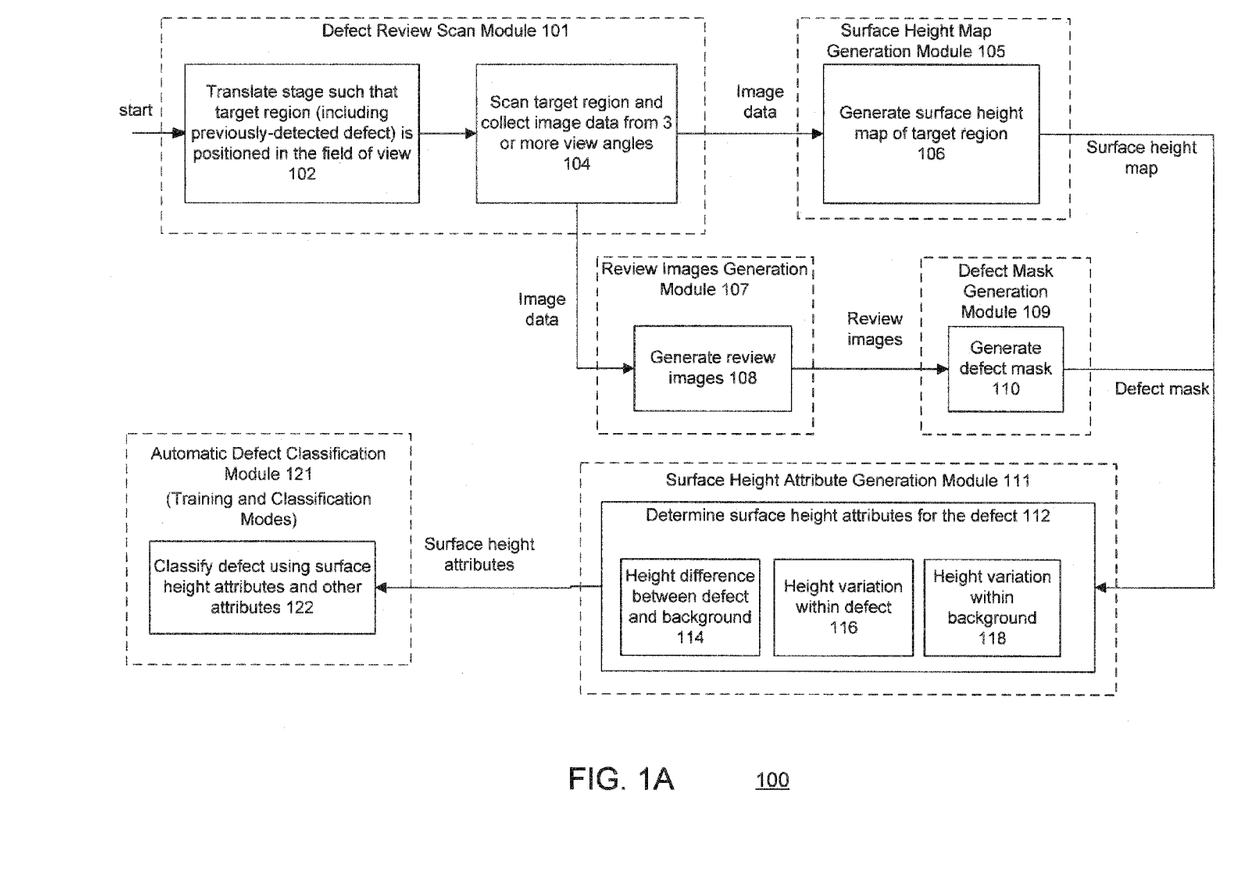
FIG. 1A is a flow chart of a method for classifying defects using surface height attributes in accordance with a first embodiment of the invention.

FIG. 1A is a flow chart of a method 100 for the automated generation of surface height attributes for a previously-detected defect so as to classify the defect in accordance with a first embodiment of the invention. The method 100 of FIG. 1A may be particularly suitable for use with a bare substrate, such as a bare silicon wafer.

As shown, the method 100 may be performed under the control of several software modules of the defect review system. These modules may include a defect review scan module 101, a surface height map generation module 105, a review images generation module 107, a defect mask generation module 109, a surface height attribute generation module 111, and an automatic defect classification module 121. Each module may include computer-readable program code which may be stored in data storage (such as a hard disk drive or memory circuits) and executed by one or more microprocessors of a computer system, such as a computer system used for instrument control and image processing for a defect review system, for example.

As shown, the defect review scan module 101 may translate 102 a stage holding a substrate such that a target region of the substrate surface is positioned in the field of view (FOV) of the imaging system. Thereafter, while the target region is scanned by the incident beam, image data is collected 104 from two or more view angles. The collection 104 of the image data from two or more view angles may be done simultaneously.

After the secondary electron image data is collected 104 of the target region, the surface height map generation module 105 may receive the image data and generate 106 a surface height map of the target region. In accordance with one embodiment, the procedure to generate 106 the surface height map may include the generation of a three-dimensional model or representation of the surface of the target region. Such a three-dimensional representation may be constructed based on a Lambertian model, or, alternatively, based on stereo vision. The surface height map may be generated 106 from the three-dimensional model. Other techniques may be employed to generate 106 the surface height map in other embodiments.

A review images generation module 107 may also receive the image data from the defect review scan module 101. The review images generation module 107 may generate review images 108 and provide them to a defect mask generation module 109. The defect mask generation module 109 generates 110 a defect mask corresponding to at least one of the review images. The defect mask differentiates pixels associated with the previously-detected defect from other pixels in the image frame.

Based on the surface height map of the target region and the defect mask, a set of surface height attributes may be determined 112 by a surface height attribute generation module 111. In accordance with an embodiment of the invention, the surface height attributes may include a height difference 114 between the defect area and the background area surrounding the defect area, a measure of the height variation 116 within the defect area, and a measure of the height variation 118 within the background area surrounding the defect area.

The background area surrounding the defect may be selected in an automated or manual manner. For example, the background area may be selected as those pixels within a certain range from the defect area, but not within the defect area. The height difference 114 between the defect area and the background area surrounding the defect area may be determined by calculating an average height of the defect area, calculating the average height of the background area, and calculating a difference between the two average heights. The measure of the height variation 116 within the defect area and the measure of the height variation 118 within the background area may be statistical measures. An example of a statistical measure of height variation is the standard deviation of the height.

In other embodiments, alternative surface height attributes may be used. For example, a useful surface height attribute that reflects topographic information may be generated by calculating the disparity distance or phase/orientation between the defect blobs (defect areas) detected in the secondary electron images of different perspectives of the same defect.

The surface height attributes for the previously-detected defect may then be fed (input) into an automatic defect-classification module (defect classifier) 121. The automatic defect classification module 121 may advantageously utilize the surface height attributes in classifying 122 the previously-detected defect. The classifier. The automatic defect classification module 121 may be a statistical classifier that may be operated in either a classifier training mode or a classification mode. The classifier training mode may receive the surface height attributes and other attributes of known types of defects so as to train the defect classifier used by the automatic defect classification module 121. The classification mode uses the trained defect classifier to classify a defect based on the surface height attributes and other attributes. Alternatively, the automatic defect classification module 121 may utilize a rule-based classifier.

Figure 1B:
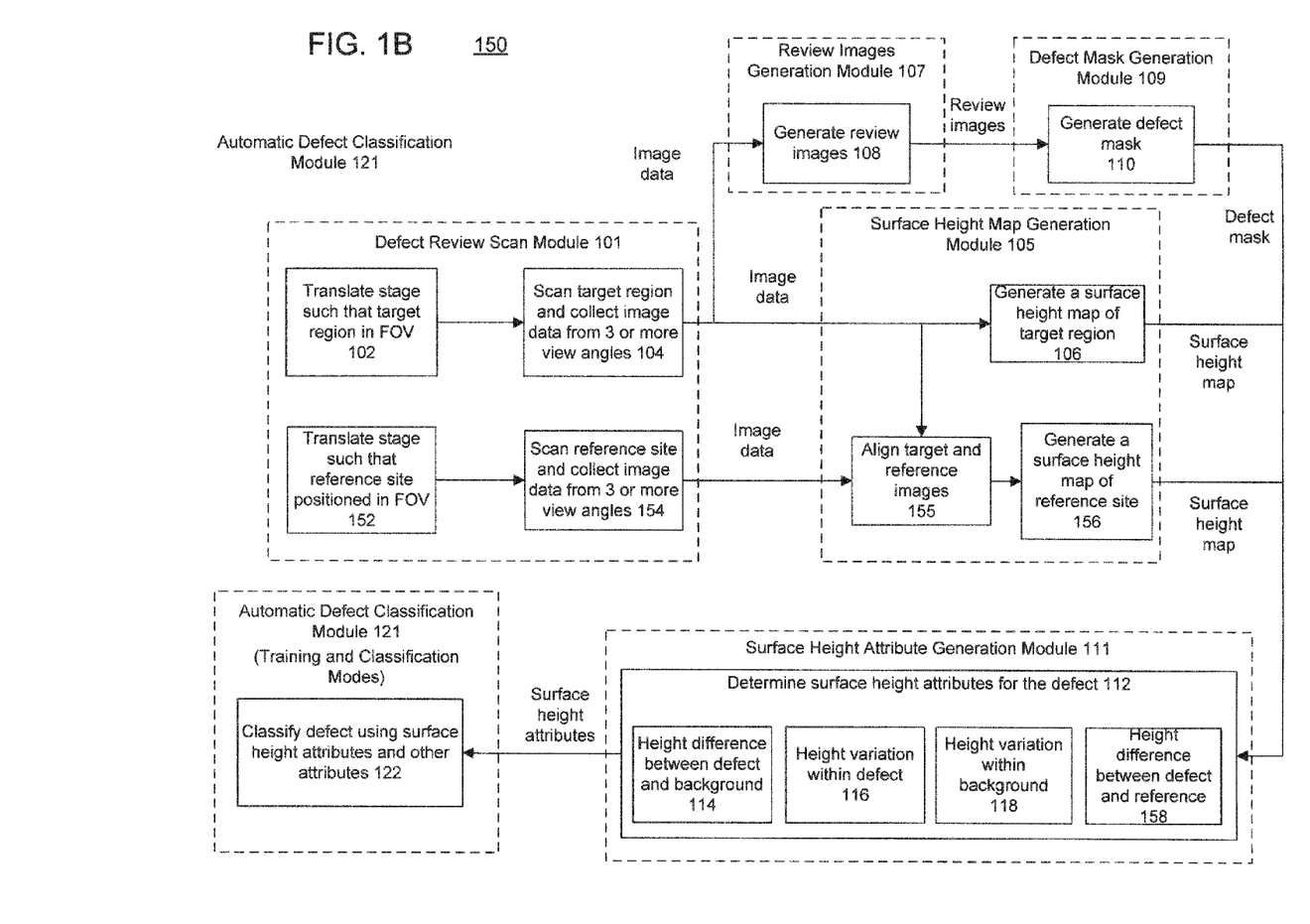
FIG. 1B is a flow chart of a method for classifying defects using surface height attributes in accordance with a second embodiment of the invention.

FIG. 1B is a flow chart of a method 150 for the automated generation of surface height attributes for a previously-detected defect so as to classify the defect in accordance with a second embodiment of the invention. The method 150 of FIG. 1B may be particularly suitable for use with a patterned substrate, such as an integrated circuit in the process of being formed on a silicon substrate, or a reticle for use in photolithography.

Compared to the method 100 of FIG. 1A, additional steps in the method 150 of FIG. 1B include steps which obtain and use image data from a reference site that corresponds to the target region. The reference site includes a non-defective area which corresponds to the defect area in the target region. In addition, the method 150 of FIG. 1B includes an additional surface height attribute that is generated by the surface height attribute generation module 111. This additional attribute is the height difference 158 between the defect area in the target region and the corresponding area in the reference site.

As shown in FIG. 1B, the defect review scan module 101 may obtain the image data from the reference site by translating 152 a stage holding the substrate such that the reference site is positioned in the field of view of the imaging system. The reference site may then be scanned by the incident beam and image data may be collected 154 from two or more view angles. The collection 154 of the image data from two or more view angles may be done simultaneously. After the secondary electron image data is collected 154 of the reference site, the surface height map generation module 105 may receive the image data, align 155 the image data of the reference site with the image data of the target region, and generate 156 a surface height map of the reference site. The surface height generation module 111 receives the surface height maps for the target region and the reference site and also receives the defect mask.

In accordance with this embodiment, the attributes generated by the surface height generation module 111 include may include the height difference 114 between the defect area and the background area surrounding the defect area, the measure of the height variation 116 within the defect area, the measure of the height variation 118 within the background area surrounding the defect area, and the height difference 158 between the defect area and the corresponding area of the reference site. The latter height difference 158 may be determined by measuring each of the two heights relative to a height of surrounding background area in its image frame. In other words, the height of the defect area relative to its background area is computed, the height of the corresponding non-defective area at the reference site relative to its background area is computed, and then the difference 158 is found between those two heights.

Figure 4A:
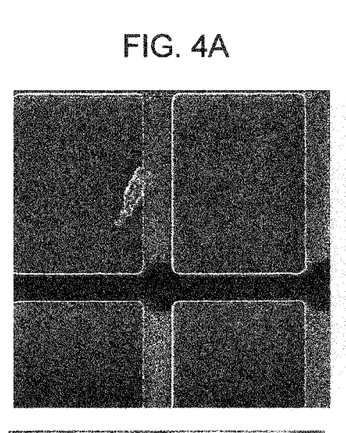
FIGS. 4A, 4B and 4C show three secondary electron image frames collected at different view angles for an example target region in accordance with an embodiment of the invention.
Figure 4B:
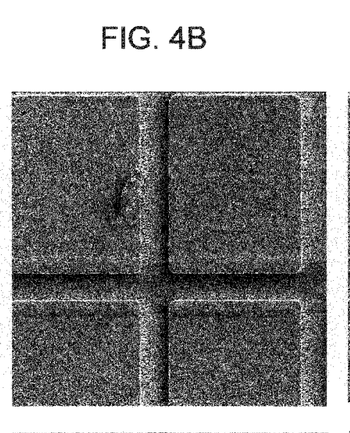
Figure 4C:
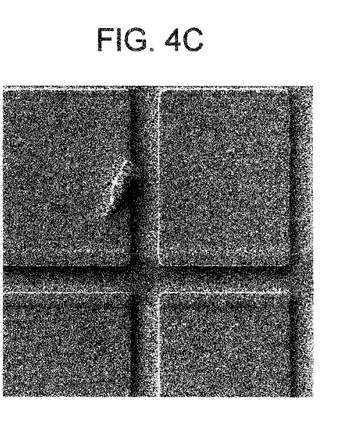
Figure 5A:
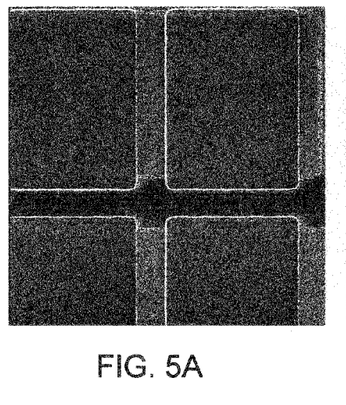
FIGS. 5A, 5B, and 5C show three corresponding secondary electron image frames collected at different view angles for a reference site corresponding to the example target region in accordance with an embodiment of the invention.
Figure 5B:
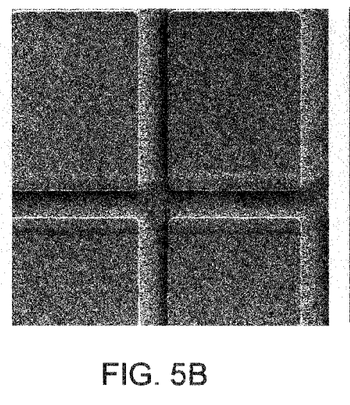
Figure 5C:
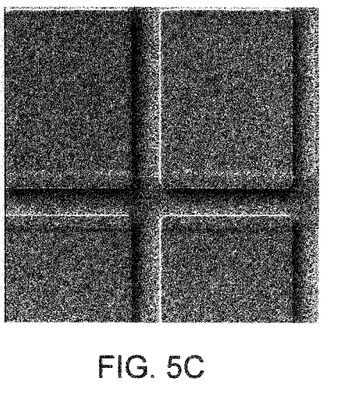
Figure 6:
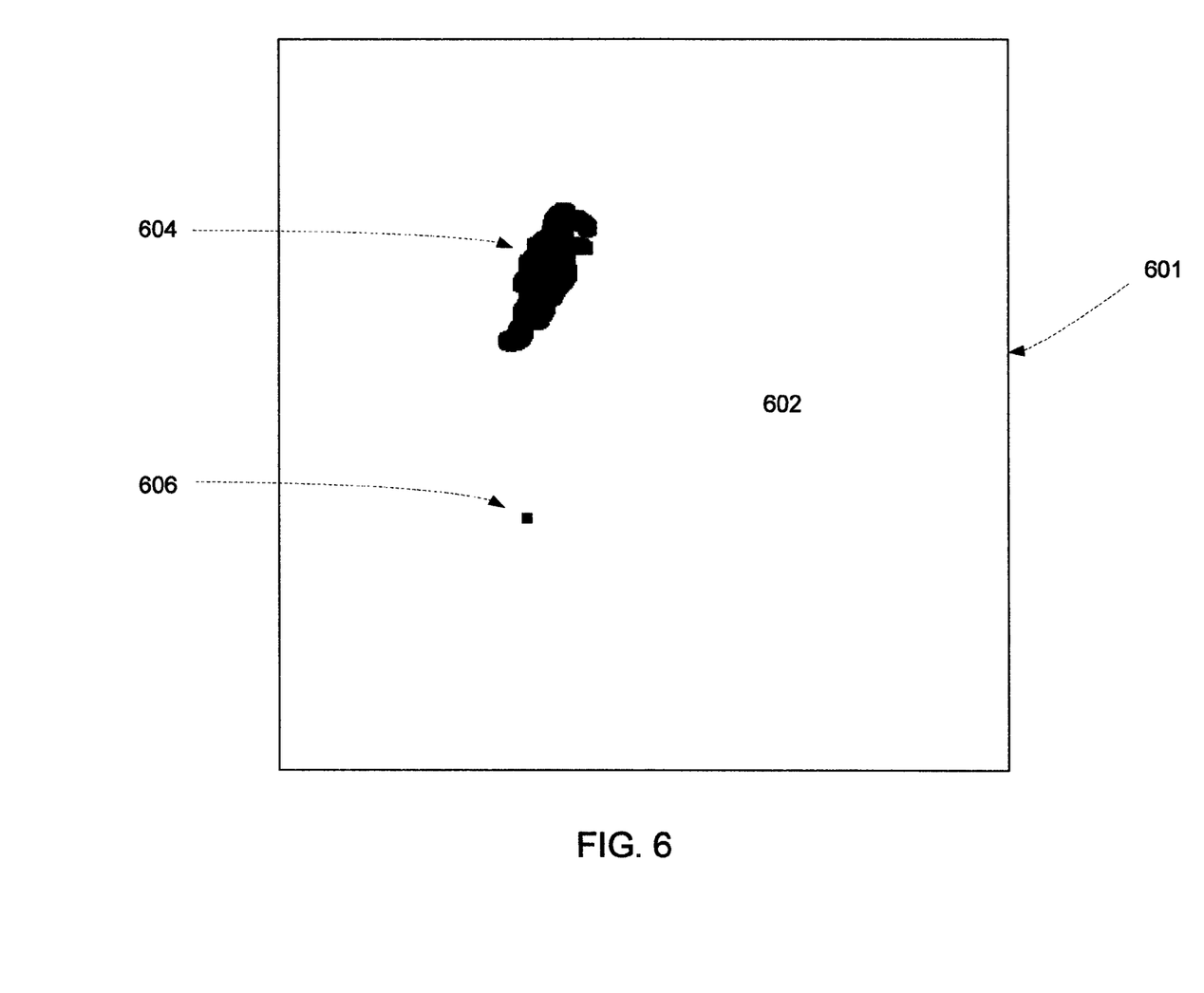
FIG. 6 shows a defect mask generated for the example target region in accordance with an embodiment of the invention.
Figure 7A:
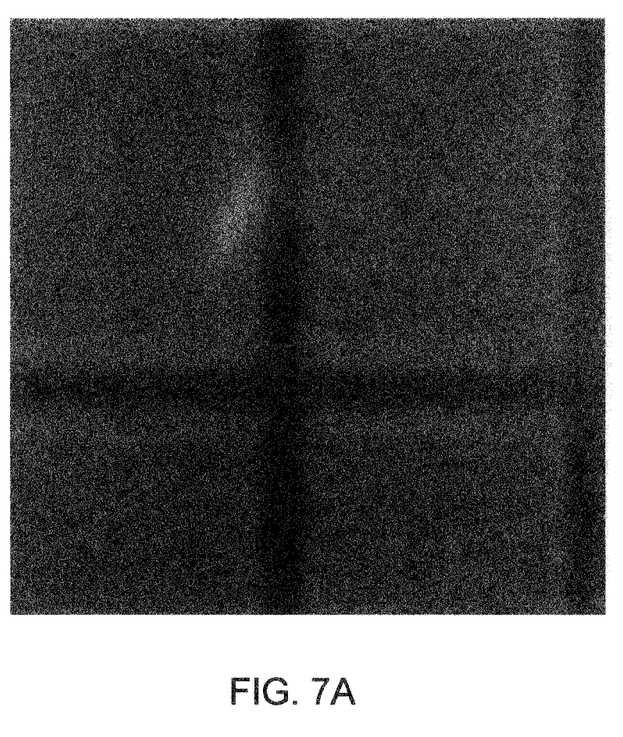
FIGS. 7A and 7B show surface height maps for the example target region and corresponding reference site, respectively, in accordance with an embodiment of the invention.
Figure 7B:
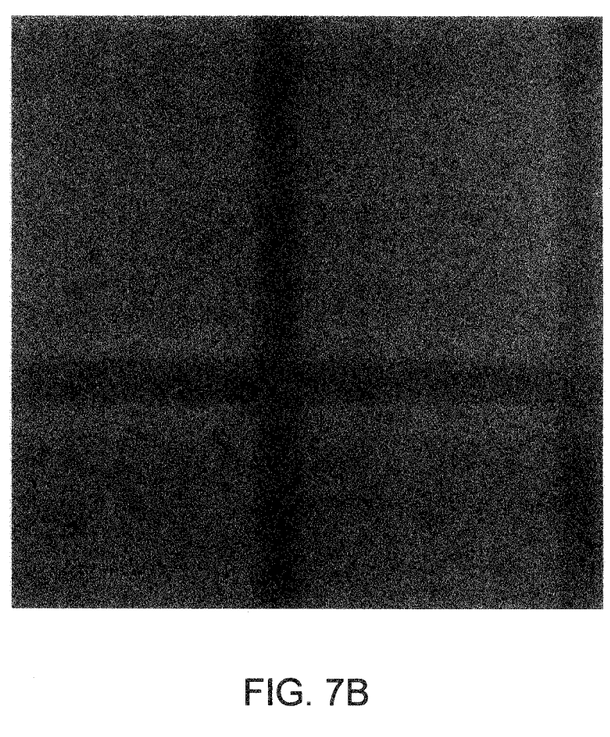

As described above, the method 150 of FIG. 1B may obtain two or more secondary electron image frames at different view angles for both the target region (which includes the previously-detected defect) and a corresponding reference site (which does not have the defect). An example of three secondary electron image frames collected 104 at different view angles for a target region including a defect is shown in FIGS. 4A, 4B, and 4C. A corresponding example of three secondary electron image frames collected 154 at different view angles for reference site which does not have the defect is shown in FIGS. 5A, 5B, and 5C. An example of a defect mask generated 110 for the target region is shown in FIG. 6. For the particular mask 601 shown in FIG. 6, the non-defective pixels 602 are shows as white pixels, the pixels associated with two defects 604 and 606 are shown as dark pixels. Further in this example, FIG. 7A shows a surface height map generated 106 for the target region, and FIG. 7B shows a surface height map generated 156 for the reference site. In surface height maps of FIGS. 7A and 7B, higher surface heights are represented by lighter grey-scale pixels and lower surface heights are represented by darker grey-scale pixels.

Figure 8:
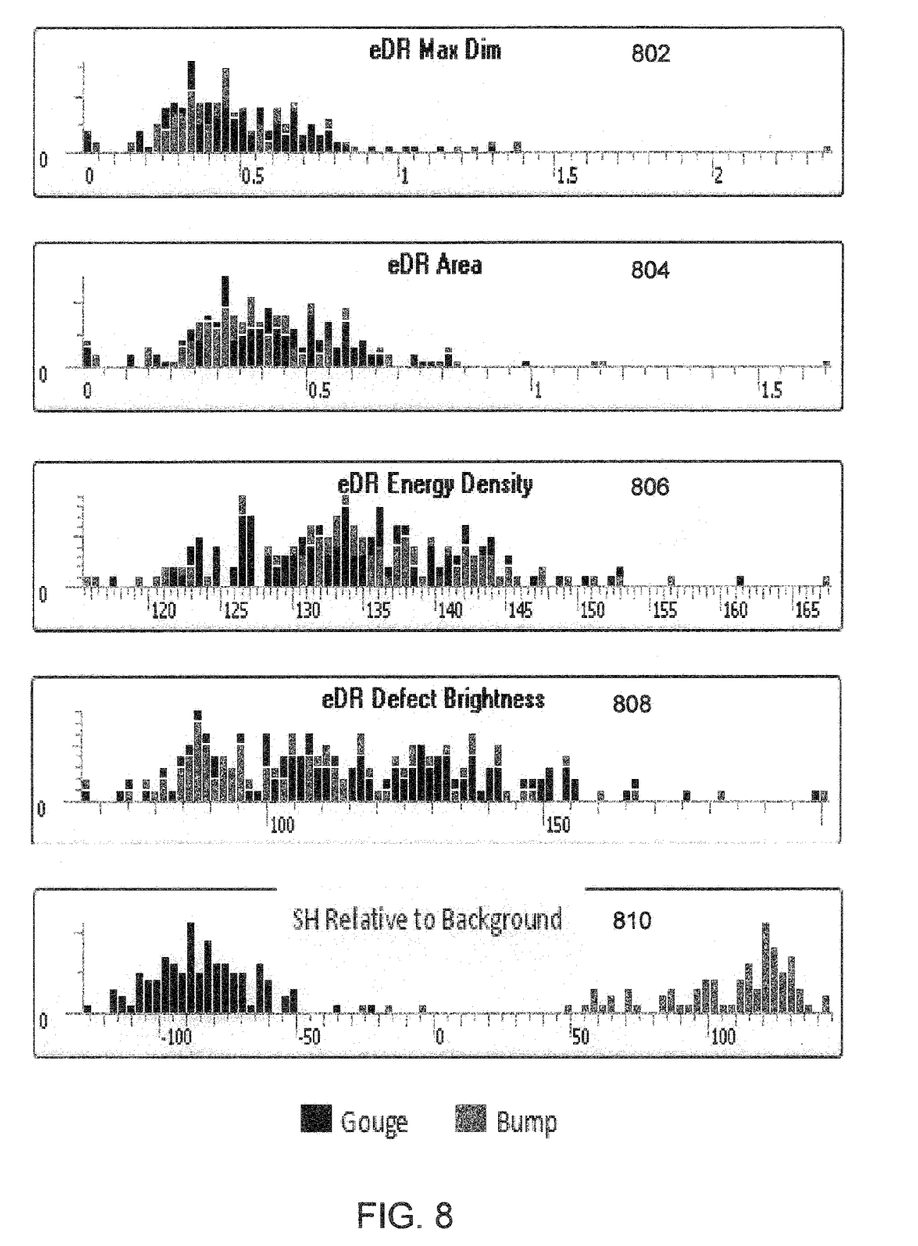
FIG. 8 shows the effectiveness of surface height attributes in distinguishing between certain types of defects in accordance with an embodiment of the invention.

In accordance with an embodiment of the invention, defect classification using the surface height attributes is highly advantageous in the classification of certain types of defects. For example, FIG. 8 shows that various conventional attributes have great difficulty distinguishing between defects which are "gouges" and defects which are "bumps".

Conventional attributes for defect classification include a maximum dimension (eDR Max DIm) 802 of the defect, an area (eDR Area) 804 of the defect, an energy density (eDR Energy Density) 806 of the defect area, and a brightness (eDR Defect Brightness) 808 of the defect area. As seen, defects which are bumps not well separated from defects which are gouges using these conventional attributes. In contrast, the height difference 114 of the defect area relative to the background area (SH Relative to Background) 810 is shown to be highly effective in separating defects which are bumps and defects which are gouges. In the example of FIG. 8, the height difference 114 is negative fifty units or less for the vast majority of the gouges and is positive fifty units or more for the vast majority of bumps.

Figure 9A:
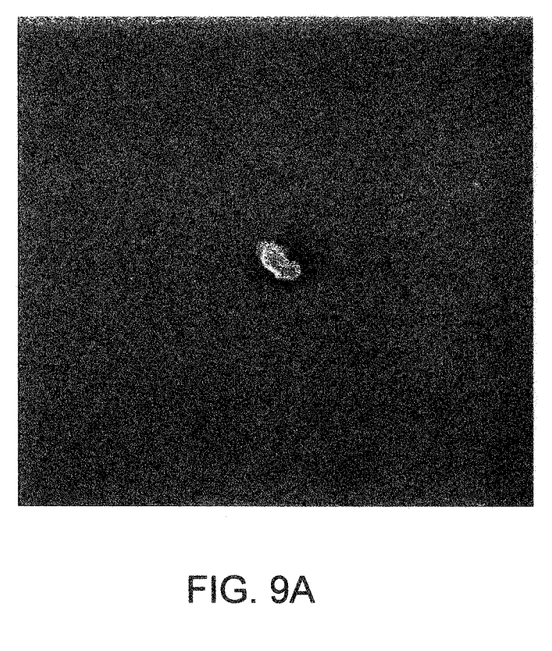
FIGS. 9A and 9B show example secondary electron image frames of a fall-on particle (i.e. a bump) and a gouge, respectively.
Figure 9B:
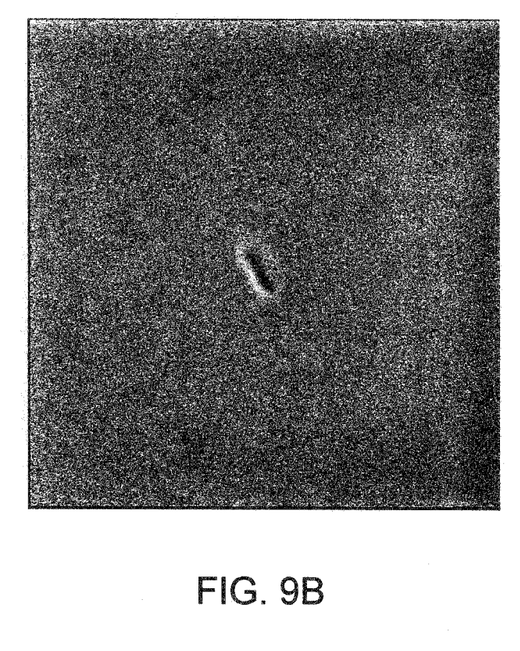
Figure 10A:
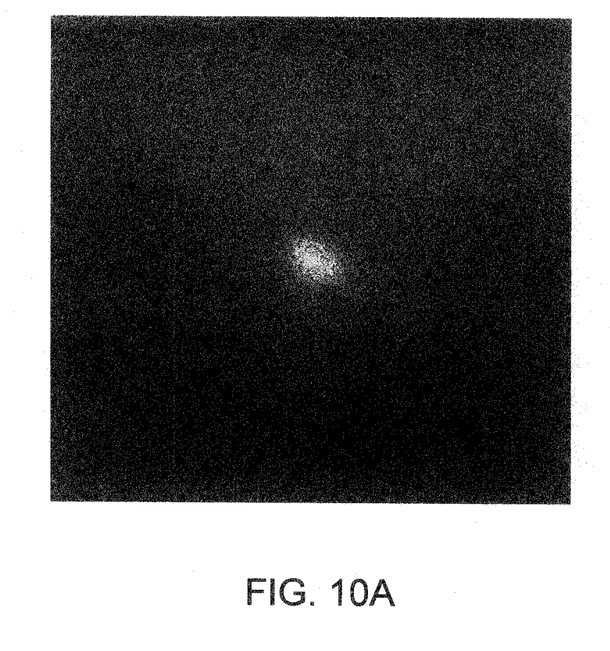
FIGS. 10A and 10B show example surface height maps for the particle and the gouge, respectively.
Figure 10B:
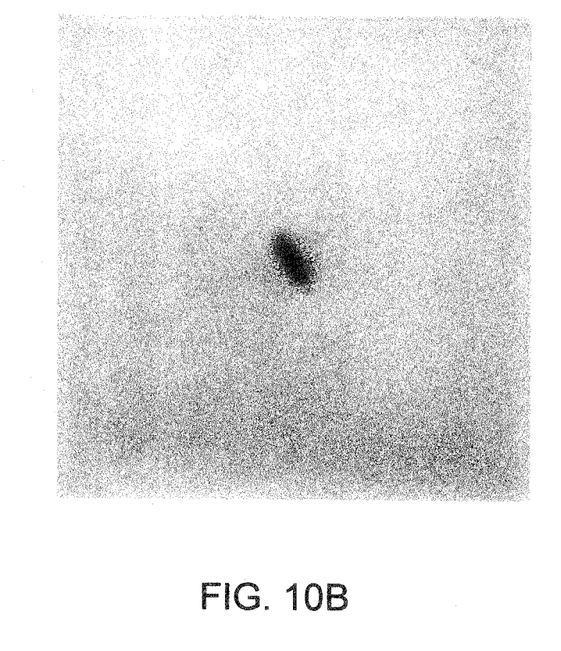
Figure 11A:
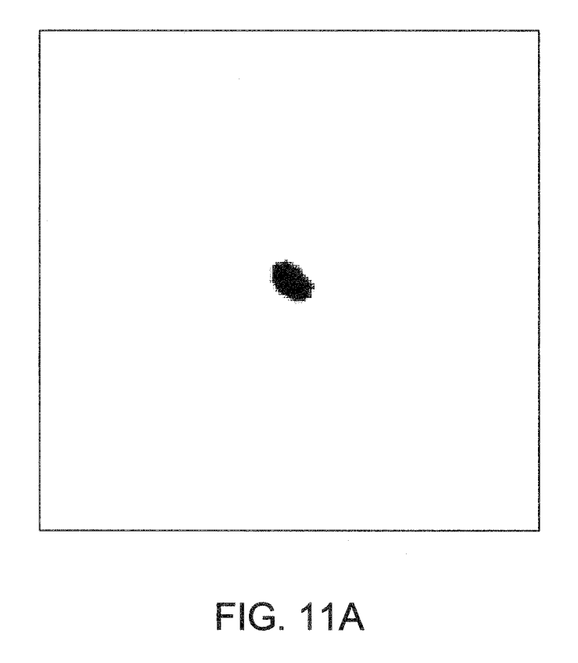
FIGS. 11A and 11B show example defect masks corresponding to the particle and gouge, respectively.
Figure 11B:
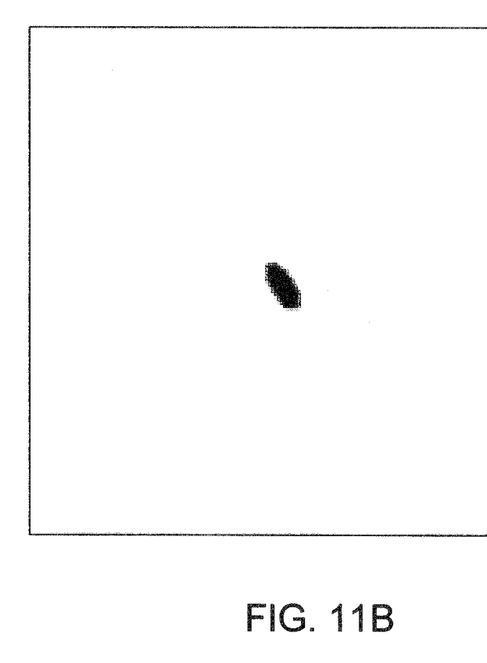

Example secondary electron image frames of a fall-on particle and a gouge are shown in FIGS. 9A and 9B, respectively. Note that from these images alone, the particle and gouge are similar in appearance. Example surface height maps for the particle and the gouge are shown in FIGS. 10A and 10B, respectively. In these maps, lighter pixels represent higher surface heights, while darker pixels represent lower surface heights. As seen, the defect is lighter (higher) than the background in FIG. 10A, while the defect is darker (lower) than the background in FIG. 10B. Example defect masks corresponding to the particle and gouge are shown in FIGS. 11A and 11B, respectively. The dark areas in the masks represent the defect areas.

More generally, the surface height attributes generated in accordance with embodiments of the invention may be used advantageously to assist in the more robust and detailed classification of defects when used in conjunction with other attributes. Even defects which are flat in relation to the background area may be more readily classified using the surface height attributes disclosed herein. This is because the surface height attributes may be used to distinguish such a flat defect from a bump or gouge.

Figure 2:
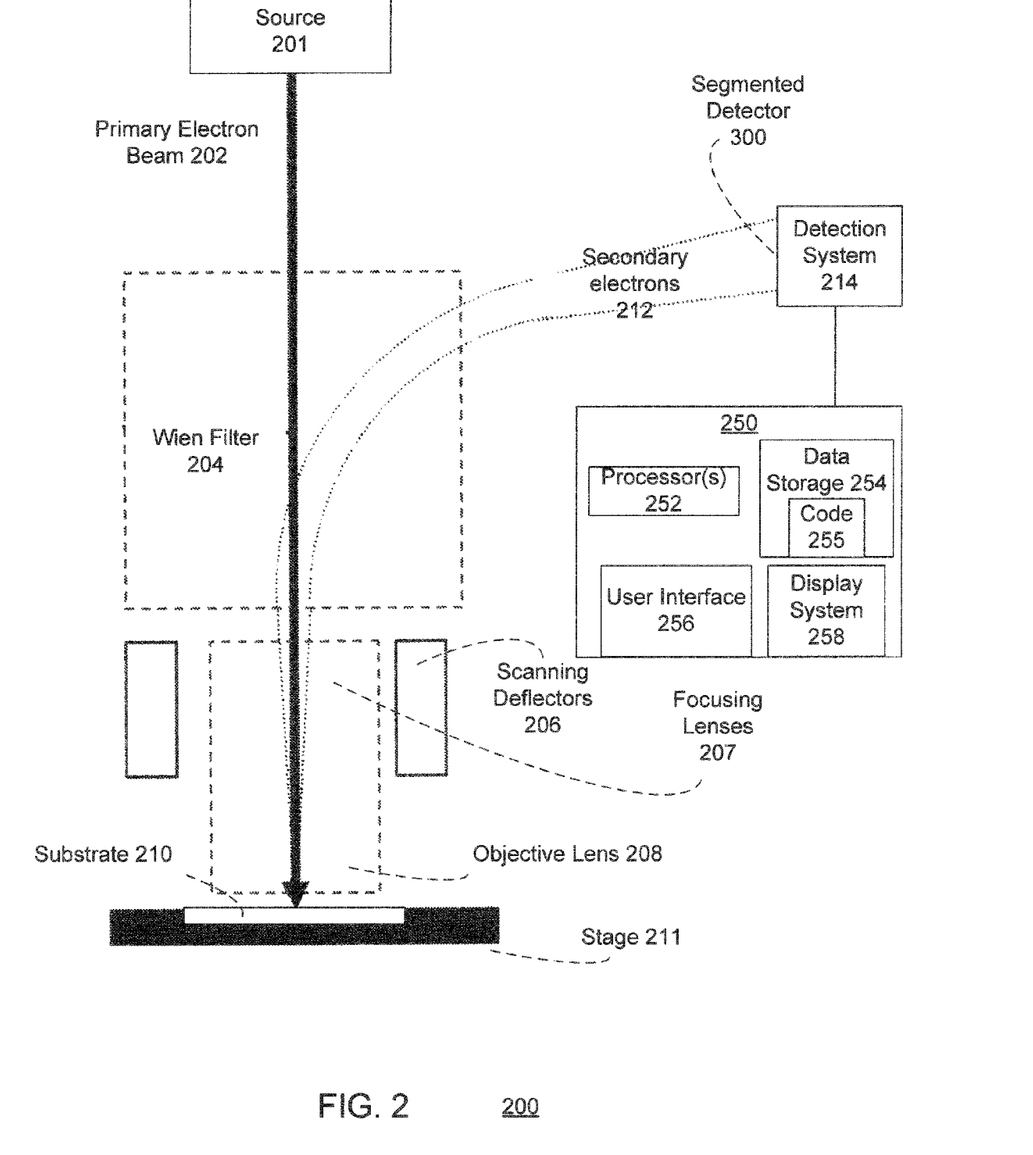
FIG. 2 is a schematic diagram of an electron beam apparatus in accordance with an embodiment of the invention.
Figure 3:
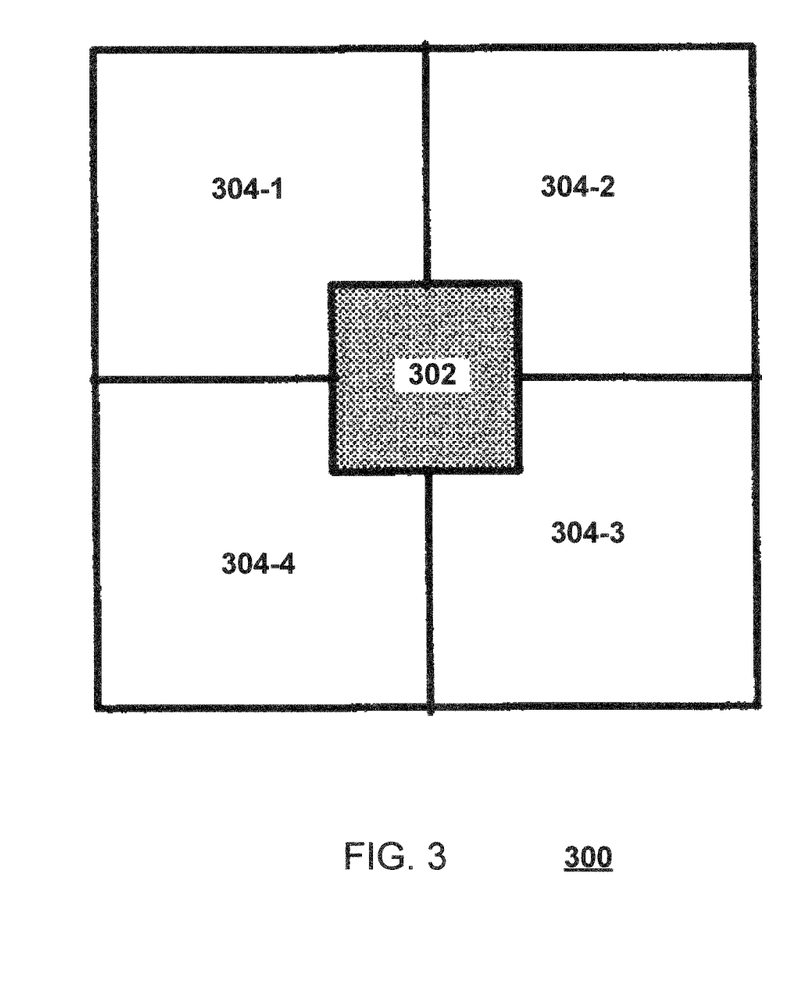
FIG. 3 is a schematic diagram of a detector segmentation in accordance with an embodiment of the invention.

An exemplary embodiment of an apparatus configured to simultaneously collect the image data from multiple view angles is described below in relation to FIGS. 2 and 3. FIG. 2 provides a cross-sectional diagram of the electron beam column, and FIG. 3 provides a planar view of a segmented detector that may be used with the column.

As shown in FIG. 2, a source 201 generates a primary beam (i.e. an incident beam) 202 of electrons. The primary beam 202 passes through a Wien filter 204. The Wien filter 204 is an optical element configured to generate electrical and magnetic fields which cross each other. Scanning deflectors 206 and focusing electron lenses 207 are utilized. The scanning deflectors 206 are utilized to scan the electron beam across the surface of the wafer or other substrate sample 210. The focusing electron lenses 207 are utilized to focus the primary beam 202 into a beam spot on the surface of the wafer or other substrate sample 210. In accordance with one embodiment, the focusing lenses 207 may operate by generating electric and/or magnetic fields.

As a result of the scanning of the primary beam 202, secondary electrons are emitted or scattered from the surface of the substrate 210 (which may be, for example, a semiconductor wafer or a reticle). The substrate 210 may be held by a movable stage 211. The secondary electrons are then extracted from the substrate 210 by exposure to the electromagnetic field of the objective (final) lens 208. The electromagnetic field acts to confine the emitted electrons to within a relatively small distance from the primary beam optic axis and to accelerate these electrons up into the column. In this way, a secondary electron beam 212 is formed from the secondary electrons.

The Wien filter 204 deflects the scattered electron beam 212 from the optic axis of the primary beam 202 to a detection axis (the optic axis for the detection system 214 of the apparatus). This serves to separate the scattered electron beam 212 from the primary beam 202. In accordance with one embodiment of the invention, the detection system 214 may include, for example, a segmented detector 300, which is shown in further detail in FIG. 3.

An instrument control and image processing (control/processing) system 250 may include one or more processors (i.e. microprocessors or microcontrollers) 252, data storage (including, for example, hard disk drive storage and memory chips) 254, a user interface 256 and a display system 258. The data storage 254 may be configured to store or hold computer-readable program code (instructions) 255 and data, and the processor 252 may be configured to execute the program code 255 and process the data. The user interface 256 may be configured to receive user inputs. The display system 258 may be configured to display views of the substrate surface to a user.

The control/processing system 250 may be connected to, and may be used to control, various components of the electron beam column so as to implement procedures disclosed herein. For example, the movement of the stage 211, and the scanning by the deflectors 206 may be controlled by computer-readable program code 255 executed by the control/processing system 250.

In addition, the control/processing system 250 may be configured to receive and process the electron image data from the detection system 214. In particular, the computer-readable program code 255 in the control/processing system 250 may be used to implement procedures relating to the automated classification of defects using surface height attributes which are described in the present disclosure.

As shown in FIG. 3, the segmented detector 300 may include five sensors or detector segments 302, 304-1, 304-2, 304-3, and 304-4. The center (on-axis) segment 302 may be configured to detect image data from a center of the scattered electron beam 212. The center segment 302 is on-axis in that it lies on the detection axis. The image data from the center segment 302 may correspond to image data from a normal view (i.e. a view angle which is normal to the sample surface at a polar angle of zero degrees). The four outer (off-axis) segments (304-1, 304-2, 304-3, and 304-4) may correspond to image data from angular views (i.e. view angles which are non-normal to the sample surface at a non-zero polar angle and at different azimuthal angles). In other words, each of the four outer segments (304-1, 304-2, 304-3, and 304-4) detect scattered electrons emitted from the substrate surface at a different azimuthal angle (for example, spaced approximately 90 degrees apart), but at the same, or approximately the same, polar angle. The outer segments (304-1, 304-2, 304-3, and 304-4) are off-axis in that they lie off the detection axis. In alternative implementations, different segmentations may be implemented.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of classifying a defect on a substrate surface, the method comprising:
    scanning a primary electron beam over a target region of the substrate surface causing secondary electrons to be emitted therefrom, wherein the target region includes the defect;
    detection of the secondary electrons from the target region using a plurality of at least two off-axis sensors so as to generate a plurality of image frames of the target region, each image frame of the target region including data from a different off-axis sensor;
    processing the plurality of image data frames to generate a surface height map of the target region;
    determining surface height attributes for the defect based on the surface height map of the target region, wherein the surface height attributes include a difference in height between an average height of a defect area and an average height of a background area surrounding the defect area; and
    feeding the surface height attributes for the defect into a defect classifier.

2. The method of claim 1, wherein the surface height attributes further include a statistical measure of height variation within the defect area.

3. The method of claim 2, wherein the surface height attributes further include a statistical measure of height variation within the background area surrounding the defect area.

4. The method of claim 3, wherein the substrate surface comprises a bare semiconductor surface.

5. The method of claim 3, wherein the substrate surface comprises a patterned surface.

6. The method of claim 5, further comprising:
    detection of the secondary electrons from a reference site using the plurality of at least two off-axis sensors so as to generate a plurality of image frames of the reference site, each image frame of the reference site including data from a different off-axis sensor; and
    aligning the image frames of the target region with the image frames of the reference site.

7. The method of claim 6, further comprising:
    processing the plurality of image frames of the reference site to generate a surface height map of the reference site.

8. The method of claim 7, wherein determining the surface height attributes for the defect is also based on the surface height map of the reference site.

9. The method of claim 8, wherein the surface height attributes further includes a difference in height between the defect area relative to the background area surrounding the defect area and a corresponding non-defective area in the reference site relative to a background area surrounding the corresponding non-defective area.

10. An apparatus comprising:
    a source for generating a primary electron beam;
    scan deflectors configured to controllably deflect the primary electron beam;
    a control system configured to control the scan deflectors such that the primary electron beam is scanned over a target region such that secondary electrons are emitted therefrom, wherein the target region includes a defect;
    a detection system configured for the detection of the secondary electrons using a plurality of at least two off-axis sensors so as to generate a plurality of image frames of the target region, each image frame including data from a different off-axis sensor; and
    an image data processing system configured to process the plurality of image frames to generate a surface height map of the target region, determine surface height attributes for the defect using the surface height map of the target region, and input the surface height attributes for the defect into a defect classifier, wherein the surface height attributes include a difference in height between an average height of a defect area and an average height of a background area surrounding the defect area.

11. The apparatus of claim 10, wherein the surface height attributes further include a statistical measure of height variation within the defect area.

12. The apparatus of claim 11, wherein the surface height attributes further include a statistical measure of height variation within the background area surrounding the defect area.

13. The apparatus of claim 10, wherein the off-axis sensors comprise off-axis detector segments.

14. The apparatus of claim 10, wherein the control system is further configured to control the scan deflectors such that the primary electron beam is scanned over a reference site so that a plurality of image frames of the reference site is generated by the detection system.

15. The apparatus of claim 14, wherein the image data processing system is further configured to align the image frames of the target region with the image frames of the reference site.

16. The apparatus of claim 15, wherein the image data processing system is further configured to process the plurality of image frames of the reference site so as to generate a surface height map of the reference site.

17. The apparatus of claim 16, wherein the image processing system if further configured to also use the surface height map of the reference site in determining the surface height attributes of the defect.

18. The apparatus of claim 17, wherein the surface height attributes comprise:
   a statistical measure of height variation within the defect area;
   a statistical measure of height variation within the background area surrounding the defect area; and
   a difference in height between the defect area and a corresponding non-defective area in the reference site.

19. The method of claim 2, wherein the statistical measure comprises a standard deviation.

20. The apparatus of claim 11, wherein the statistical measure comprises a standard deviation.

* * * * *